United States Patent [19]
Wakita et al.

[11] Patent Number: 5,556,706
[45] Date of Patent: Sep. 17, 1996

[54] CONDUCTIVE LAYERED PRODUCT AND METHOD OF MANUFACTURING THE SAME

[75] Inventors: Katsuya Wakita, Nara; Shu Hotta, Kawasaki; Nobuo Sonoda, Settsu, all of Japan; Yang Yang, Santa Barbara, Calif.

[73] Assignee: Matsushita Electric Industrial Co., Ltd., Osaka, Japan

[21] Appl. No.: 132,348

[22] Filed: Oct. 6, 1993

[51] Int. Cl.$^6$ ....................................................... B32B 9/04
[52] U.S. Cl. .......................... 428/421; 428/704; 428/910; 252/500
[58] Field of Search ...................................... 428/704, 421, 428/910; 252/500

[56] References Cited

U.S. PATENT DOCUMENTS

| | | | |
|---|---|---|---|
| 3,957,382 | 5/1976 | Greuel, Jr. et al. | 156/155 |
| 4,731,311 | 3/1988 | Suzuki et al. | 429/213 |
| 4,996,097 | 2/1991 | Fischer et al. | 428/901 |
| 5,137,799 | 8/1992 | Kaempf et al. | 526/256 |

*Primary Examiner*—Mark D. Sweet
*Attorney, Agent, or Firm*—Fish & Richardson PC

[57] ABSTRACT

A conductive layered product is made by adhering an oligothiophene compound to the surface of a polytetrafluoroethylene (PTFE), wherein the surface of said PTFE is oriented by an orientation treatment, and wherein the molecular chains of said oligothiophene compound are oriented and crystallized in the orientation direction of the PTFE, thus improving the orientation of the oligothiophene compound of a low molecular conductive material by a simple method. The oligothophene compound adhered to the PTFE oriented film is oriented and crystallized. A gaseous-phase method and a casting method are acceptable methods for adhering the compound. It is preferable to use oligothiophene compounds with 4–6 polymerization degrees. The oligothiophene compound, in which the $\alpha$ position at the end of molecular chains is replaced with an alkyl group, can also be used.

8 Claims, 8 Drawing Sheets

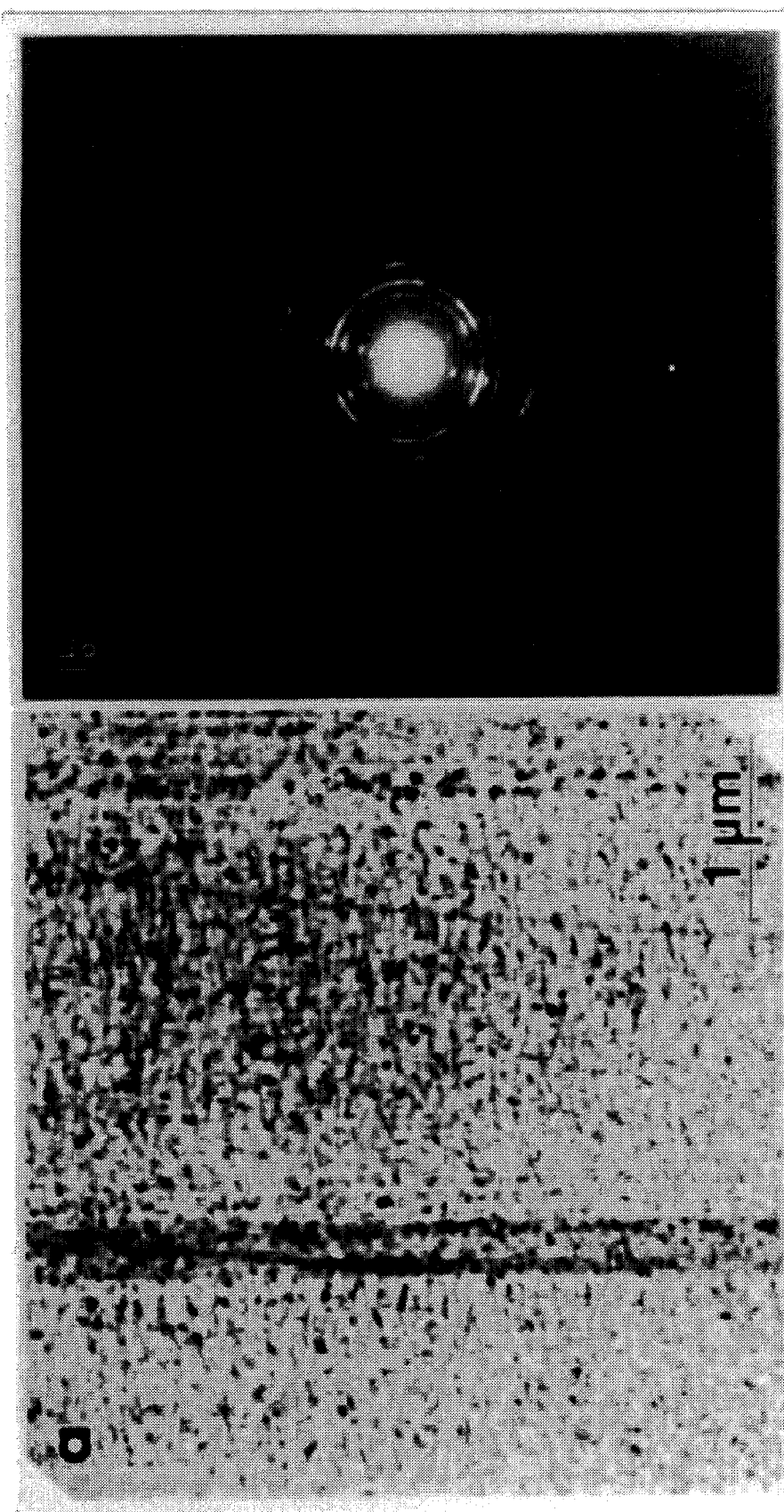

5,556,706

CONDUCTIVE LAYERED PRODUCT AND METHOD OF MANUFACTURING THE SAME

FIELD OF THE INVENTION

The invention relates to a method of controlling the orientation properties of conductive oligomers used for electronic devices such as thin film transistors or the like in liquid crystal drives.

BACKGROUND OF THE INVENTION

Similar to conductive polymers, conductive oligomers are used as conductive materials for various electronic devices. Aromatic compounds comprising aromatic rings with π electrons, which are freely movable in a molecule, or one-dimensional conjugate macromolecules bonded by double bonding—such as polyacetylene—are typical examples of these conductive organic materials. The orientation of molecules or molecular chains is one of the important factors influencing the conductivity (mobility of electrons or holes) of the conductive materials.

Conventional methods of orienting compounds include the following:

natural orientation due to an interaction among molecules or molecular chains that is characteristic of the compounds;

selectively orienting the compounds in the process of forming a conductive polymer by providing a fine groove on a substrate surface and filling the groove with a reaction catalyst (Japanese Published Patent Application No. Hei 3-21861);

orienting a conductive polymer by fixing both ends of a wet conductive polymer during the process of forming the conductive polymer through electrolytic polymerization, and gradually drying and processing the polymer with heat, thus orienting the polymer due to its shrinkage (Japanese Published Patent Application No. Hei 2-44607); and orienting a conductive polymer by fixing both ends of the polymer and mechanically drawing the polymer.

The orientation of a conductive oligomer is generally created by natural orientation due to, an interaction among substituents of the molecules or van der Waals force.

However, it has been difficult for the above-noted conventional technologies to orient large areas of conductive materials or thin films of these materials. When a conductive material is applied to an electronic device, conduction carriers (electrons or holes) should have high mobility without being trapped. However, no good method has been found for orienting oligothiophene as a conductive material.

A molecular arrangement technique employing a polytetrafluoroethylene (PTFE) oriented film has been used mainly for polymer materials, and its usefulness has been realized. However, the usefulness of the above-mentioned technique for orienting materials which have rigid molecular structures and comparatively low molecular weights, such as conductive oligomers, has not been established.

SUMMARY OF THE INVENTION

In order to solve these conventional problems, the invention applies the above-noted molecular arrangement technique to oligothiophene materials, thus establishing the usefulness of the molecular arrangement technique employing a PTFE oriented film, highly orienting large areas of conductive materials or thin films of the materials, and improving the mobility of conduction carriers (electrons or holes).

In order to accomplish the above, the conductive layered product of the invention is produced by adhering an oligothiophene compound to the surface of a PTFE, wherein the PTFE is oriented by an orientation treatment, and wherein the molecular chains of the oligothiophene compound are oriented and crystallized in the direction of orientation of the PTFE.

The method of manufacturing a conductive layered product of the invention involves adhering the oligothiophene compound to the surface of a PTFE oriented film; the method orients and crystallizes oligothiophene molecular chains in the oriented direction of the PTFE oriented film.

It is preferable in the invention that the polymerization degree of the oligothiophene compound is, between four and six. The polymerization degree, however, is not limited to these numbers.

It is preferable in the invention that the oligothiophene compound is at least one compound chosen from the group consisting of terthienyl (trimer); quaterthienyl (tetramer); quinquethienyl (pentamer); sexithienyl (hexamer); 5,5"-dimethyl terthiophene; 5,5'''-dimethyl quaterthiophene; 5,5-dimethyl -quinquethiophene; 5,5'''''-dimethyl sexithiophene; 5,5"-diethyl terthiophene; 5,5'''-diethyl quaterthiophene; 5,5'''-dimethylquinquethiophene and 5,5'''''-diethyl sexithiophene.

It is preferable in the invention that an alkyl group comprising one or two carbon atoms is bonded to the α position at the end of the molecular chain of the oligothiophene compound.

The PTFE can include less than 5% mol, preferably 2% mol, of a monomer or comonomer such as hexafluoropropylene.

It is preferable in the invention that the method of contacting and adhering the oligothiophene compound to the PTFE oriented film surface is either a gaseous-phase method or a casting method.

It is preferable in the invention that the PTFE oriented film is heated during the stage of contacting the oligothiophene compound to the oriented film by the gaseous-phase method.

Based on the composition of the invention that the PTFE is oriented by an orientation treatment and that the molecular chains of the oligothiophene compound are oriented and crystallized in the oriented direction of the PTFE oriented film, the following can be accomplished:

recognizing the usefulness of the molecular arrangement technique employing the PTFE oriented film;

providing a high orientation property to large areas of conductive materials and to thin films of the materials; and increasing the mobility of conduction electrons.

According to the compositions of the method of manufacturing a conductive layered product of the invention, oligothiophene compounds can be built up on the PTFE oriented film by a gaseous-phase method or a casting method while the highly oriented property of the PTFE oriented film is maintained. The oligothiophene compound with four polymerization degrees (tetramer) has $10^{-10}$ S/cm electric conductivity while the one with five polymerization degrees (pentamer) has $10^{-8}$ S/cm electric conductivity. The oligothiophene compound with six polymerization degrees (hexamer), moreover, has $10^{-6}$ S/cm electric conductivity, as shown in J. Molecular Electronics, 7, 85 (1991). Therefore, it is preferable to use the compounds as conductive materials applied for electronic devices. The oligothiophene compound with five polymerization degrees has $10^{-5}$ cm$^{2}$/V/s, and the compound with six polymerization degrees has $5 \times 10^{-3} - 4 \times 10^{-1}$ cm$^{2}$/V/s. Thus, the invention is useful for manufacturing electronic devices that use organic materials. Furthermore, due to the orientation method of the invention, the orientation property of the oligothiophene compounds can be improved, and the mobility of the electrons can also be increased. The electron mobility of the oligothiophene derivative, in which the α position at the end of the molecules is replaced with an alkyl group, is higher than that of the oligothiophene compound in which the α position is not replaced with the group (H. Akimichi et al., Appl. Phys. Lett., 58 (14), 1500 (1991)), even though there is no specific reason for the change. The number of carbon atoms of the alkyl group is preferably one or two, but is not limited to these numbers.

By applying a gaseous-phase method or a casting method as the method of contacting the oligothiophene compounds to the PTFE oriented film, the thickness of the built-up oligothiophene layers can be freely controlled. Moreover, the orientation property of the oligothiophene layers can also be improved by heating the PTFE oriented film during the stage of building up the oligothiophene layer by the gaseous-phase method. In other words, the orientation and size of the partially oriented oligothiophene crystals can be highly improved by heating the PTFE oriented film.

BRIEF DESCRIPTION OF THE DRAWINGS

FIG. 2 shows a TEM picture of the DMSxT film of Example 1.

FIG. 3 shows an electron beam diffraction spectrum of the DMSxT film of Example 1.

DETAILED DESCRIPTION OF THE INVENTION

The oligothiophene compounds of the invention are preferably oligothiophene derivatives of oligothiophene with at least three polymerization degrees and comprising alkyl groups as substituents. Particularly, the derivative having oligothiophene with four to six polymerization degrees and an alkyl group bonded to the α position at the end of molecular chains is preferable in the invention. When the oligothiophene derivative comprising alkyl groups are used, the hydrophobic interaction of alkyl groups bonded to the end of molecular chains can significantly improve the orientation property of the oligothiophene layers. More specifically, the above-noted oligothiophene derivatives include terthienyl (trimer); quaterthienyl (tetramer); quinquethienyl (pentamer); sexithienyl (hexamer); 5, 5"-dimethyl terthiophene; 5,5'''-dimethyl quaterthiophene; 5,5''''-dimethyl quinquethiophene; 5,5'''''-dimethyl sexithiophene; 5,5"-diethyl terthiophene; 5,5'''-diethyl quaterthiophene; 5,5''''-diethyl quinquethiophene and 5,5'''''-diethyl sexithiophene. It is preferable that the alkyl group bonded to the a position at the oligothiophene molecular end comprises one or two carbon atoms; however, the number of the carbon atoms is not limited to these numbers. Furthermore, the β position as well as the α position at the oligothiophene molecular end can be substituted with suitable chemical groups, as disclosed in P. Bauerle, Adv. Mater., 4, 102 (1992), J. Guay and A. Diaz, Chem. Mater. 4, 254 (1992), etc.

The PTFE oriented film of the invention is formed by the method of J. C. Wittmann and P. Smith (Nature, Vol. 352, 414 (1991)). More specifically, the PTFE oriented film formed on substrates with smooth surfaces such as glass and silicon is heated, and is slid while pressure is applied to the substrates. As a result, a PTFE oriented film is formed in which molecular chains are oriented in the direction of sliding.

As methods of contacting oligothiophene to PTFE oriented films, gaseous-phase methods such as the vacuum deposition method, CVD method, MBE method or the like, casting methods including the spin coating method, blade coating method or the like and a solid-phase method (applicable to compounds with a 340° C. or below melting point of the PTFE films) are included.

In employing the casting method, it is preferable to use chlorobenzene; chloroform; methyl chloride; acetone; xylene; 1, 2, 4-trichlorobenzene; dimethylformamide (DMSO) or the like as the agent dissolving oligothiophene.

The invention is explained further in detail by referring to the following examples.

EXAMPLE 1

Figure 1:
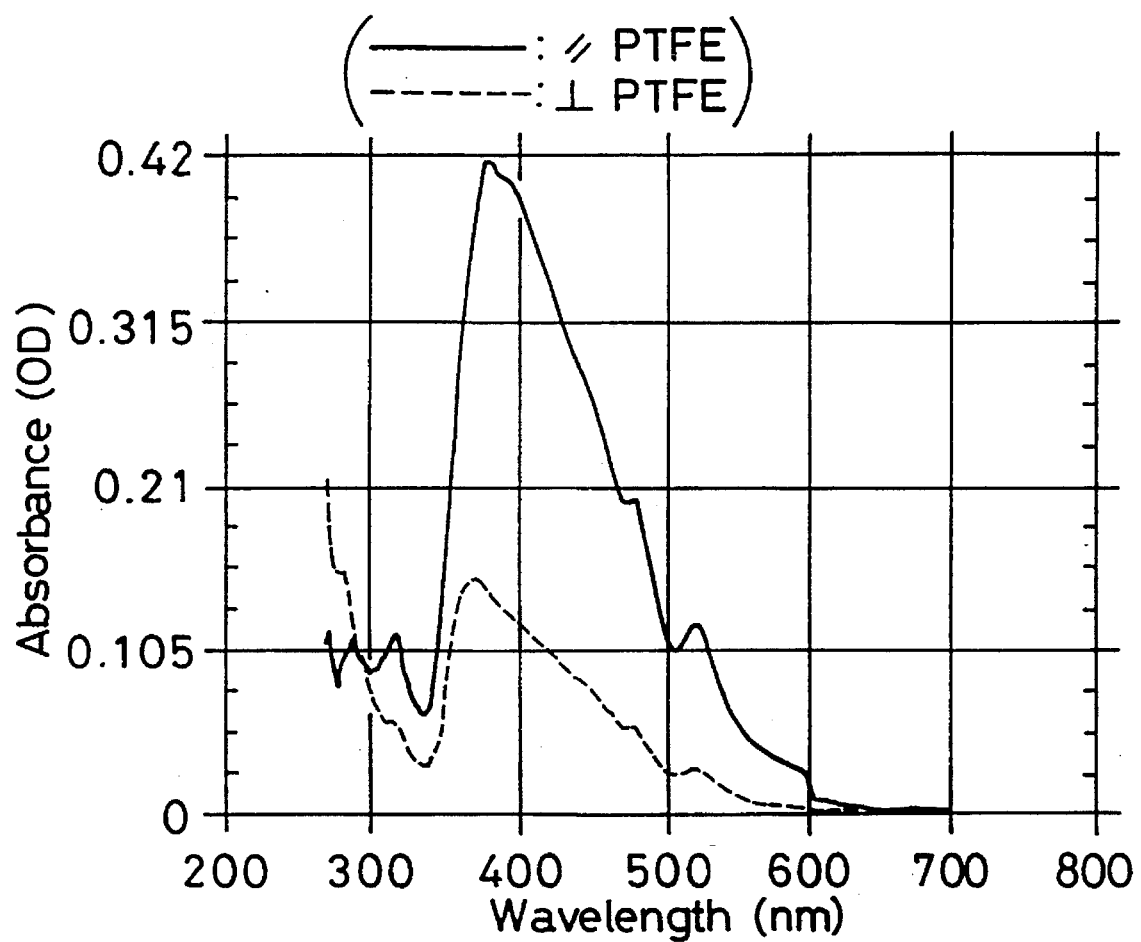
FIG. 1 shows a polarization absorption spectrum of the DMSxT film of Example 1.

A glass substrate formed with a PTFE oriented film was placed in a vacuum deposition apparatus, and 5,5'''''-dimethyl sexithiophene (DMSxT) was deposited on the glass substrate under $1 \times 10^{-5}$ Torr of vacuum. More specifically, 10 mg of DMSxT was placed in a tungsten boat, and the deposition of the DMSxT to the glass substrate was promoted by resistance heating while the distance between the deposition source and the substrate surface was kept at 10 cm. For the above-noted procedure, 29–30 Amps of electric current was supplied to the deposition source. A TEM (Transmission Electron Microscope) was used to observe the DMSxT film formed on the PTFE oriented film, and the dichroism of the absorption spectrum was also measured. FIG. 1 shows the absorption spectrum of the DMSxT film. The absorption of oligothiophene molecules in the direction parallel to the PTFE molecular chains was significantly large according to this observation. Particularly, with 3.4 eV photoabsorption energy at π-π* transition, the ratio of the absorption intensity of the oligothiophene molecules parallel to the PTFE molecular chain direction (oriented direction of PTFE) to the absorption intensity of the molecules horizontal to the molecular chain direction was about 1.94. In case of depositing DMSxT directly on the glass substrate which was not formed with a PTFE oriented film, the oligothiophene molecular chains were crystallized in a direction perpendicular to the substrate surface. In case of depositing DMSxT on the PTFE oriented film, the oligothiophene molecular chains were crystallized parallel to the PTFE oriented direction. FIG. 2 is a TEM picture of an oriented DMSxT film. FIG. 3 is an electron beam diffraction diagram of an oriented DMSxT film.

EXAMPLE 2

Figure 4:
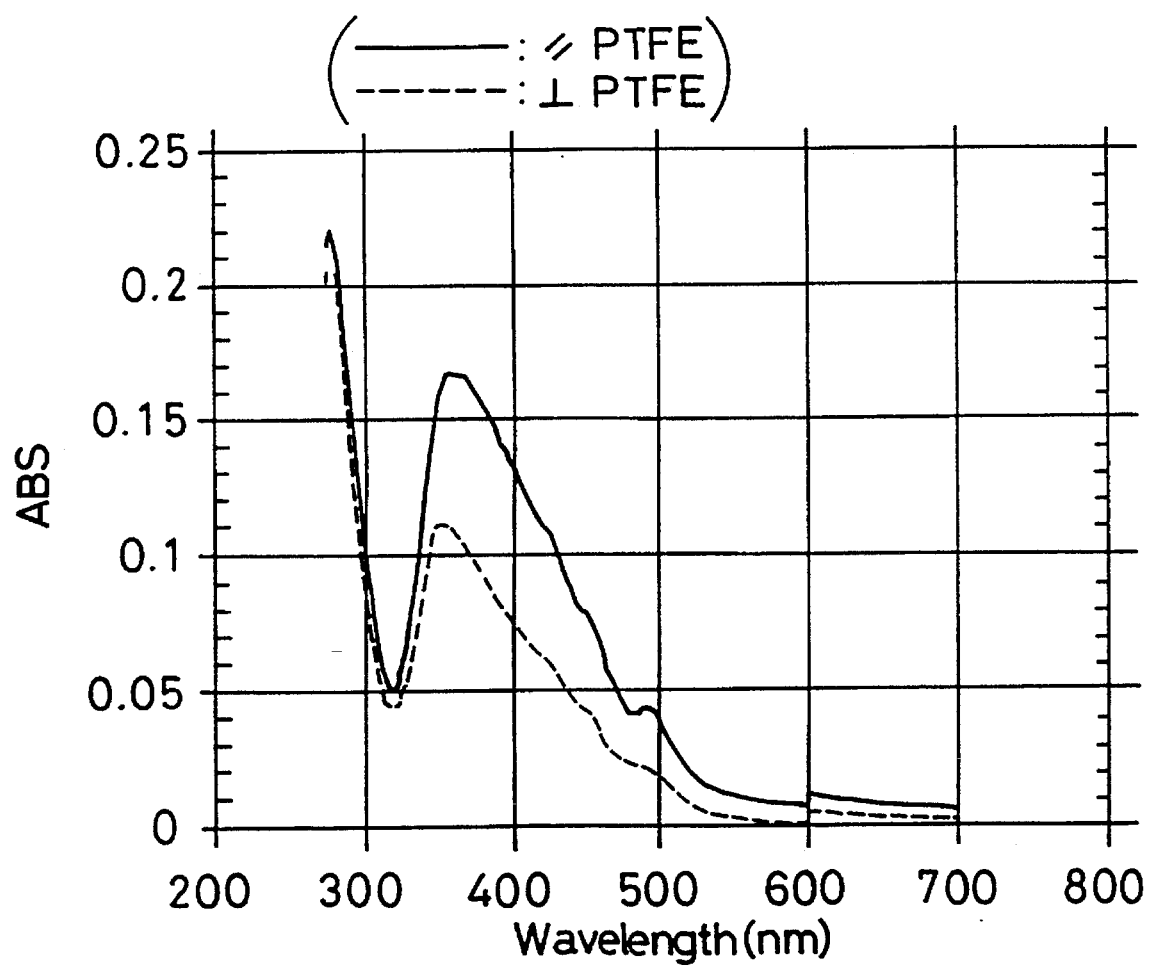
FIG. 4 shows a polarization absorption spectrum of the DMQqT film of Example 2.
Figures 5, 6:
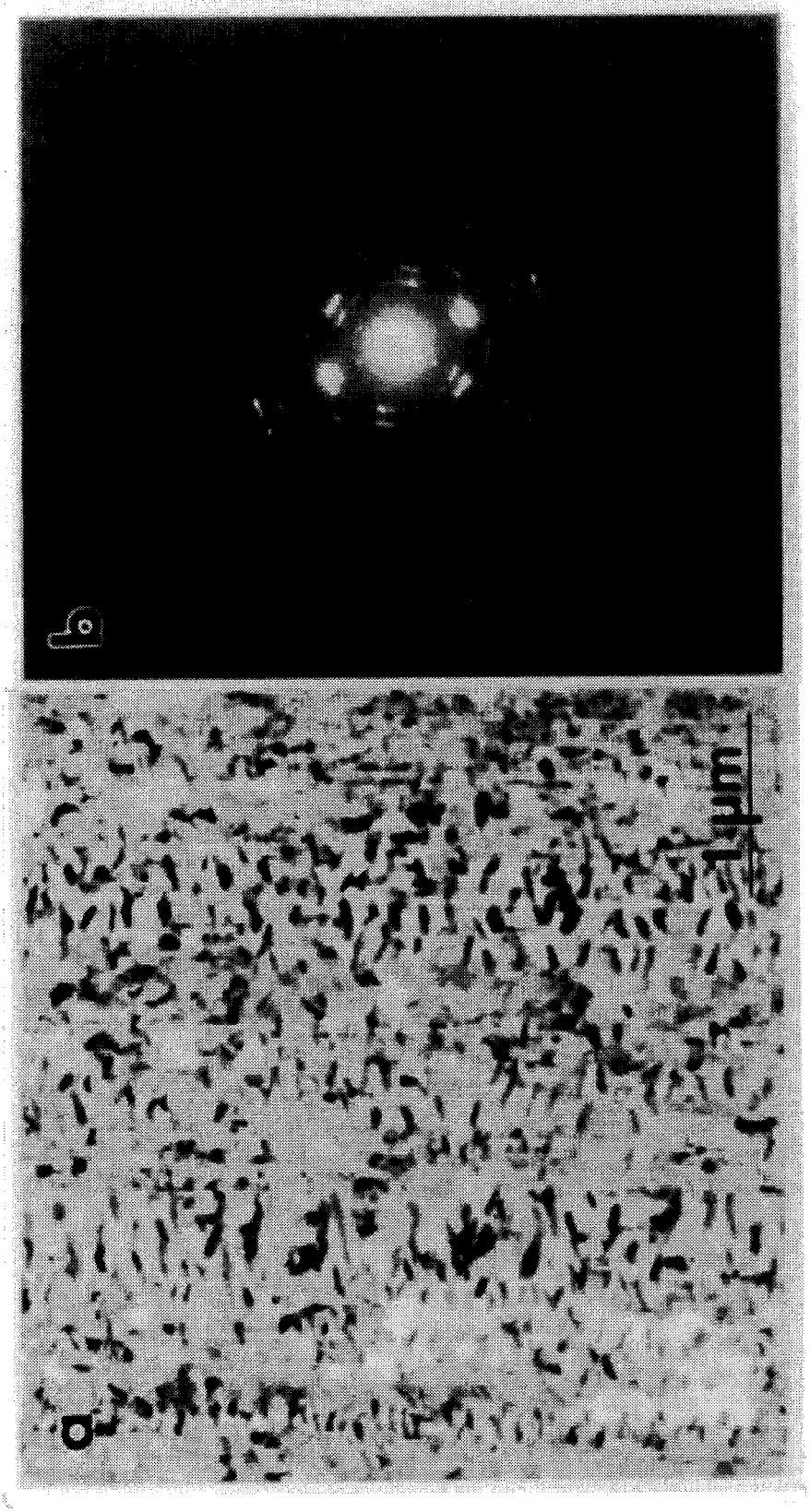
FIG. 5 shows a TEM picture of the DMQqT film of Example 2.
FIG. 6 shows an electron beam diffraction spectrum of the DMQqT film of Example 2.

A glass substrate formed with a PTFE oriented film was placed in a vacuum deposition apparatus, and 5,5""-dimethyl quinquethiophene (DMQqT) was deposited on the glass substrate under 1×10$^{-5}$ Torr of vacuum. More specifically, 10 mg of DMQqT was placed in a tungsten boat, and DMQqT was deposited to the glass substrate by resistance heating while the distance between the deposition source and the substrate surface was kept at 10 cm. For the above-noted procedure, 26–27 Amps of electric current was supplied to the deposition source. FIG. 4 shows the absorption spectrum of the DMQqT film. The absorption of oligothiophene molecules in the direction parallel to the PTFE molecular chains was significantly large according to this observation. Particularly, with 3.5 eV photoabsorption energy at π-π* transition, the ratio of the absorption intensity of the oligothiophene molecules parallel to the PTFE molecular chain direction (oriented direction of PTFE) to the absorption intensity of the molecules horizontal to the molecular chain direction was about 1.45. In case of depositing DMQqT directly on the glass substrate which was not formed with PTFE oriented film, the oligothiophene molecular chains were crystallized in a direction perpendicular to the substrate surface. In case of depositing DMQqT on the PTFE oriented film, the oligothiophene molecular chains were crystallized parallel to the oriented direction of the PTFE molecular chains. FIG. 5 is a TEM picture of an oriented DMQqT film. FIG. 6 is an electron beam diffraction diagram of an oriented DMQqT film.

EXAMPLE 3

Figure 7:
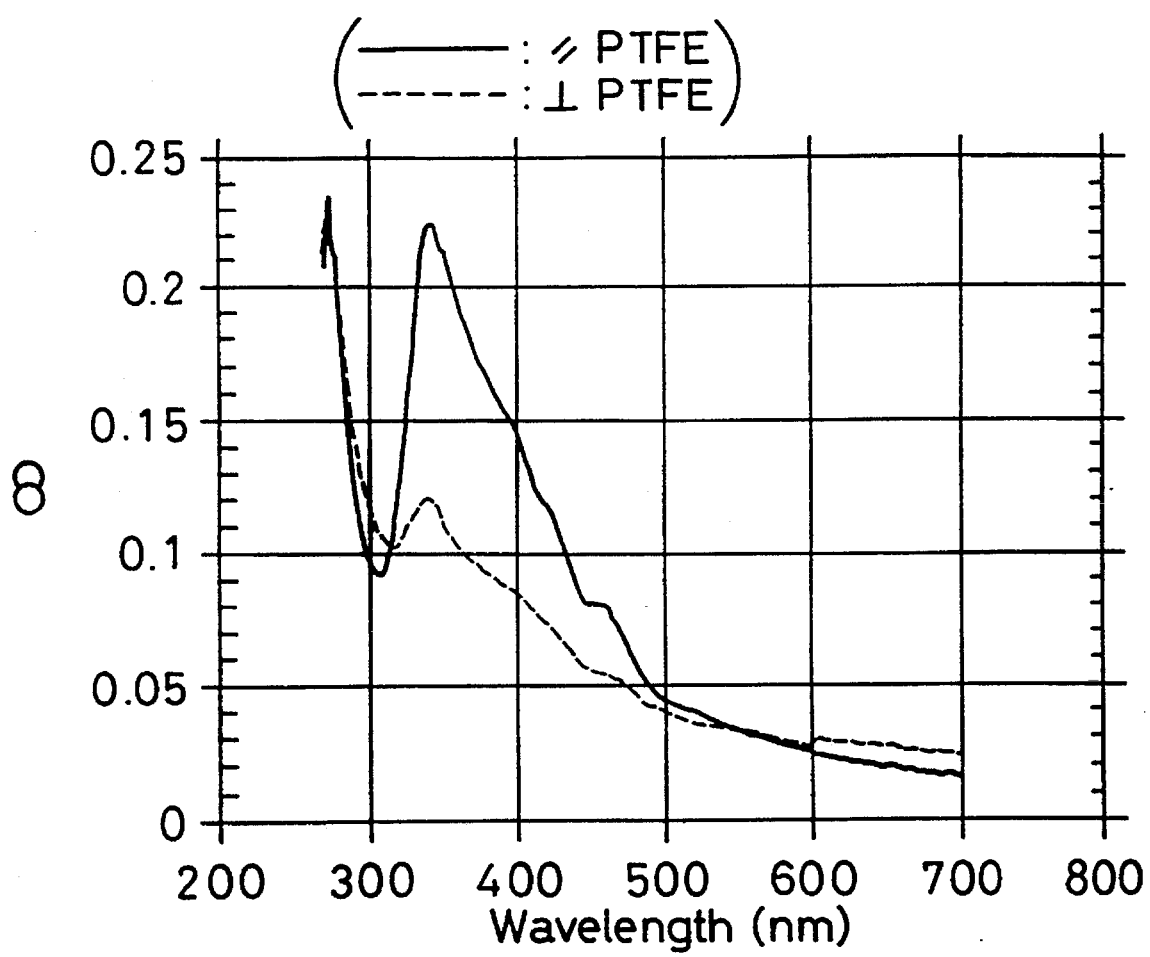
FIG. 7 shows a polarization absorption spectrum of the DMQtT film of Example 3.
Figure 8:
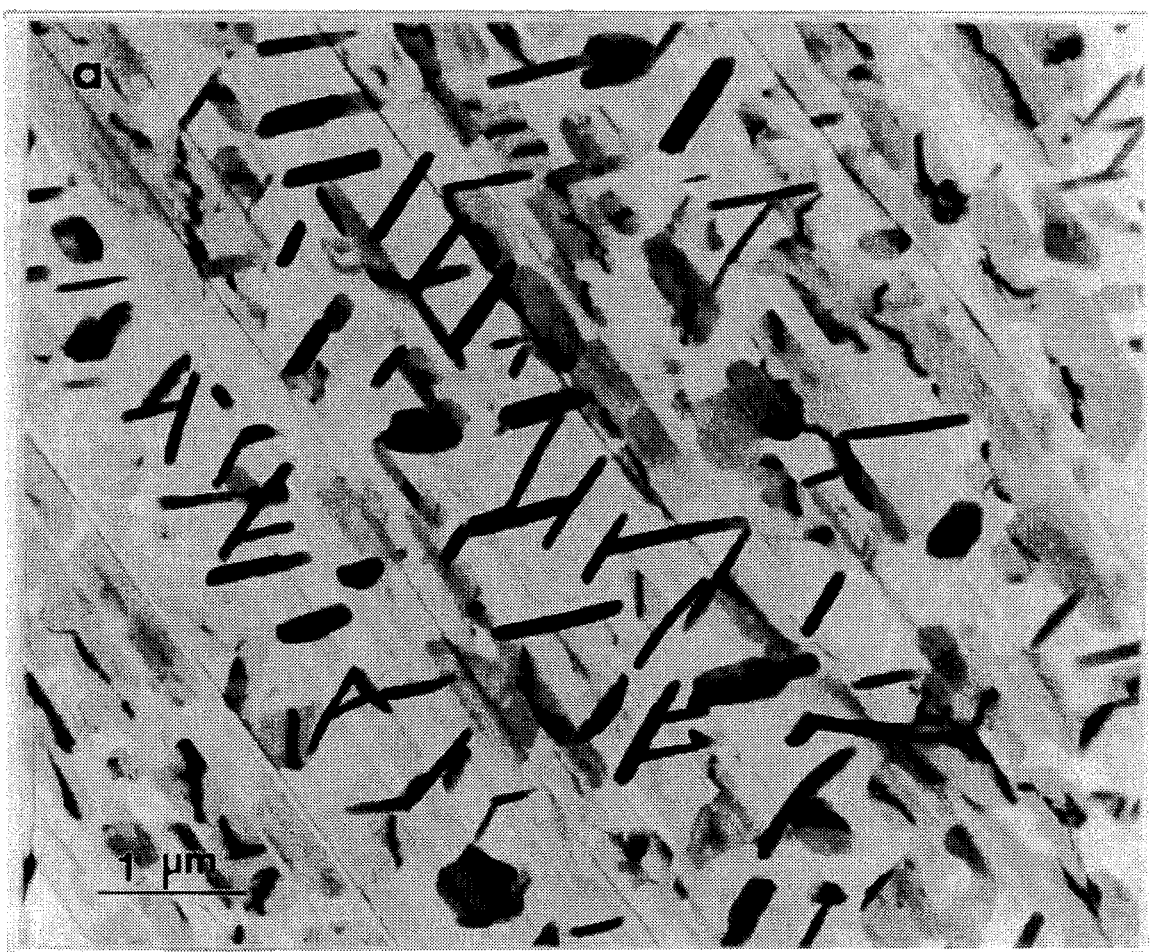
FIG. 8 shows a TEM picture of the DMQtT film of Example 3.
Figure 9:
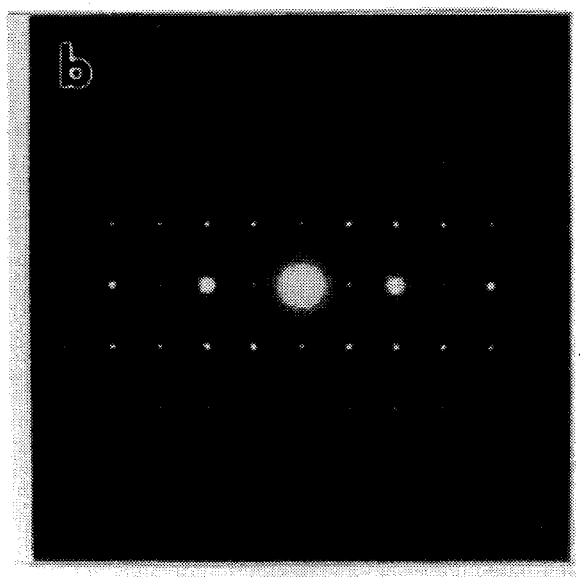
FIG. 9 shows an electron beam diffraction diagram of the DMQtT film of Example 3.

A glass substrate formed with a PTFE oriented film was placed in a vacuum deposition apparatus, and 5, 5'''-dimethyl quaterthiophene (DMQtT) was deposited to the glass substrate under 1×10$^{-5}$ Torr of vacuum. More specifically, 10 mg of DMQtT was placed in a tungsten boat, and DMQtT was deposited to the substrate by resistance heating while the distance between the deposition source and the substrate surface was kept at 10 cm. For the above-mentioned procedure, 23–24 Amps of electric current was supplied to the deposition source. FIG. 7 shows the absorption spectrum of the DMQtT film. The absorption of oligothiophene molecules in the direction parallel to PTFE molecular chains was significantly large according to this observation. Particularly, with 3.7 eV photoabsorption energy at π-π* transition, the ratio of the absorption intensity of the oligothiophene molecules parallel to the PTFE molecular chain direction (oriented direction of PTFE) to the absorption intensity of the molecules perpendicular to the molecular chain direction was about 1.6. In case of depositing DMQtT directly on the glass substrate which was not formed with the PTFE oriented film, the oligothiophene molecular chains were crystallized in a vertical direction to the substrate surface. In case of depositing DMQtT on the PTFE oriented film, the oligothiophene molecular chains were crystallized parallel to the PTFE orientation direction. FIG. 8 is a TEM picture of an oriented DMQtT film. FIG. 9 is an electron beam diffraction diagram of an oriented DMQtT film.

EXAMPLE 4

Figure 10:
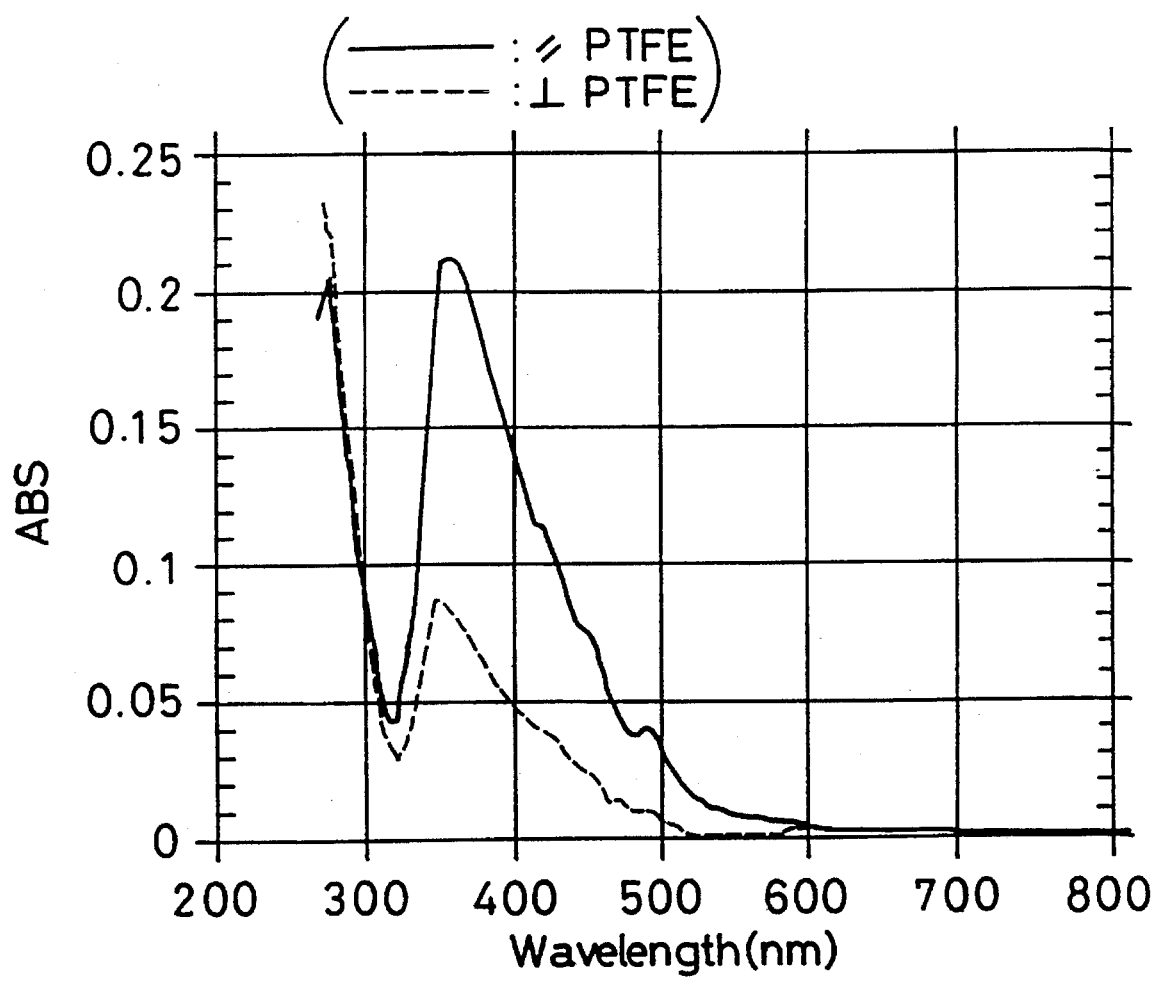
FIG. 10 shows a polarization absorption spectrum of a substrate of Example 4 deposited with DMQqT while the substrate was heated.

A glass substrate formed with a PTFE oriented film was placed in a vacuum deposition apparatus, and 5, 5""-dimethyl quinquethiophene (DMQqT) was deposited to the glass substrate under 1×10$^{-5}$ Torr of vacuum. In the deposition procedure, the glass substrate was heated to 80° C. More specifically, 2 mg DMQqT was placed in a tungsten boat, and DMQqT was deposited to the substrate by resistance heating while the distance between the deposition source and the substrate surface was kept at 10 cm. For the above-mentioned procedure, 26–27 Amps of electric current was supplied to the deposition source. The dichroism of absorption spectrum of the DMQqT film was measured. FIG. 10 shows the absorption spectrum of the DMQqT film. The absorption of oligothiophene molecules in the direction parallel to PTFE molecular chains was significantly large according to the observation. Particularly, with 3.5 eV photoabsorption energy at π-π* transition, the ratio of the absorption intensity of the oligothiophene molecules parallel to the PTFE molecular chain direction (oriented direction of PTFE) to the absorption intensity of the molecules perpendicular to the molecular chain direction was about 2.44.

EXAMPLE 5

Figure 11:
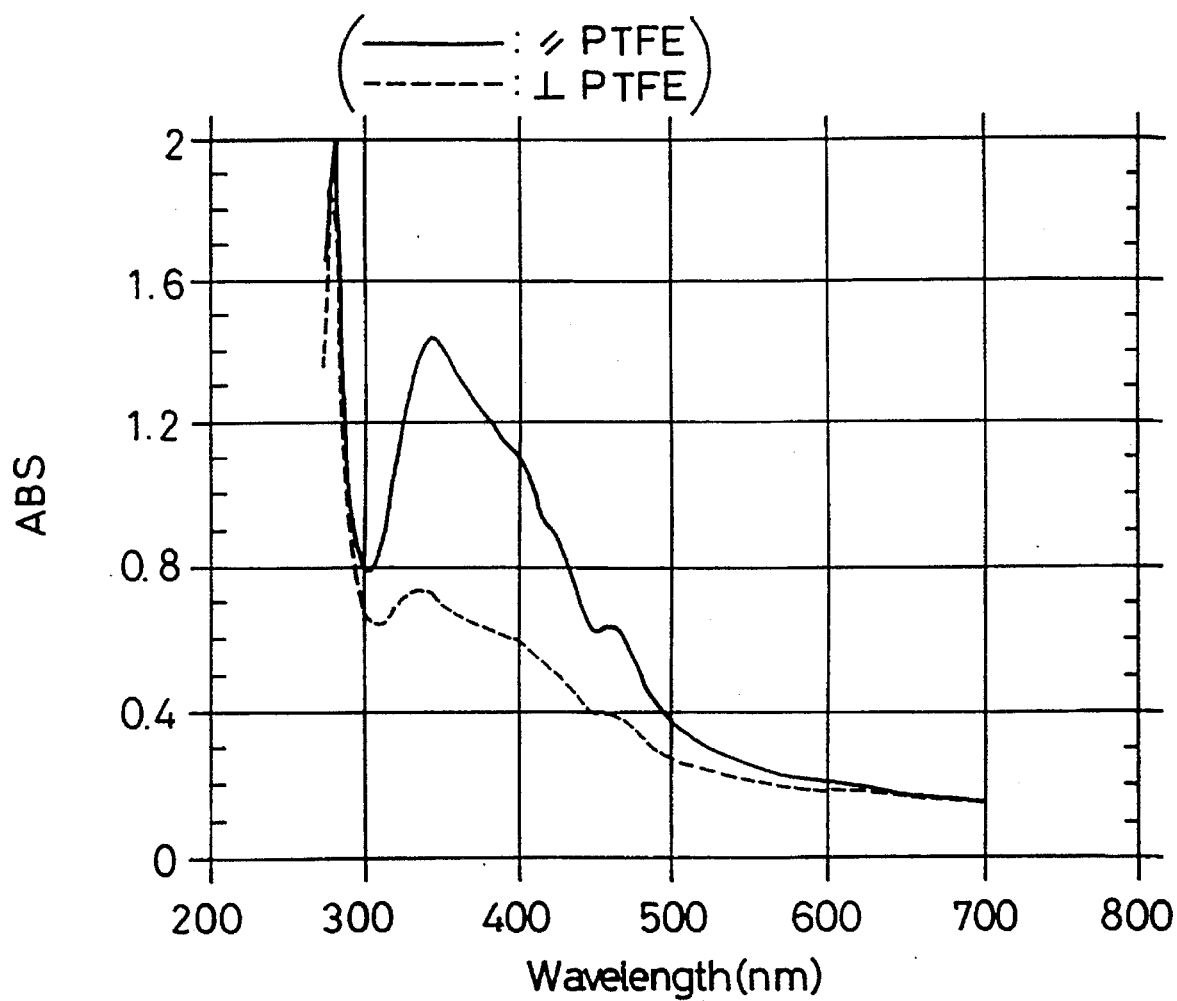
FIG. 11 shows a polarization absorption spectrum of a substrate of Example 5 deposited with DMQtT while the substrate was heated.

A glass substrate formed with a PTFE oriented film was placed in a vacuum deposition apparatus, and 5, 5"-dimethyl quarterthiophene (DMQtT) was deposited to the glass substrate under 1×10$^{-5}$ Torr of vacuum. In the deposition procedure, the glass substrate was heated at 80° C. More specifically, 2 mg DMQtT was placed in a tungsten boat, and DMQtT was deposited to the substrate by resistance heating while the distance between the depositon source and the substrate surface was kept at 10 cm. For the above-mentioned procedure, 23–24 Amps of electric current was supplied to the deposition source. The dichroism of absorption spectrum of the DMQqT film was measured. FIG. 11 shows the absorption spectrum of the DMQtT film. The absorption of oligothiophene molecules in the direction parallel to PTFE molecular chains was significantly large according to this observation. Particularly, with 3.7 eV photoabsorption energy at π-π* transition, the ratio of the absorption intensity of the oligothiophene molecules parallel to the PTFE molecular chain direction (oriented direction of PTFE) to the absorption intensity of the molecules perpendicular to the molecular chain direction was about 2.36.

Based on the method of orienting conductive oligomer of the invention, the mobility of conduction electrons in the oligomer can be improved by increasing the orientation property of low molecular weight thiophene oligomer conductive material, thus providing a suitable conductive material for electronic devices.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description, and all changes which come within the meaning and range of equivalency of the claims are intended to be embraced therein.

We claim:

1. A conductive layered product, comprising an oligothiophene compound having a degree of polymerization of four to six adhered to a surface of a polytetrafluoroethylene film, wherein molecules of said polytetrafluoroethylene are oriented in a direction, and wherein molecular chains of said oligothiophene compound are oriented and crystallized in a direction parallel to the orientation direction of said polytetrafluoroethylene.

2. A conductive layered product according to claim 1, wherein said oligothiophene compound is at least one compound chosen from the group consisting of quaterthienyl (tetramer); quinquethienyl (pentamer); sexithienyl (hexamer); 5,5'''-dimethyl quaterthiophene; 5,5''''-dimethyl quinquethiophene; 5,5'''''-dimethyl sexithiophene; 5,5'''-diethyl quaterthiophene; 5,5''''-diethyl quinquethiophene and 5,5'''''-diethyl sexithiophene.

3. A conductive layered product according to claim 1, wherein alkyl groups comprising one or two carbon atoms are bonded to the α positions at the ends of molecular chains of said oligothiophene compound.

4. A method of manufacturing a conductive layered product, comprising:

contacting and adhering an oligothiophene compound having a degree of polymerization of four to six to a surface of a polytetrafluoroethylene film which is oriented in a direction; and orienting and crystallizing molecular chains of said oligothiophene in a direction parallel to the orientation direction of said polytetrafluoroethylene.

5. A method according to claim 4, wherein the method of contacting and adhering said oligothiophene compound to the polytetrafluoroethylene oriented film is a gaseous-phase method or a casting method.

6. A method according to claim 5, wherein said polytetrafluoroethylene oriented film is heated when said oligothiophene compound is contacted to said polytetrafluoroethylene oriented film by said gaseous-phase method.

7. A method according to claim 4, wherein the α position at the ends of the oligothiophene molecules is replaced with an alkyl group.

8. A method according to claim 4, wherein said oligothiophene compound is at least one compound chosen from the group consisting of quaterthienyl (tetramer); quinquethienyl (pentamer); sexithienyl (hexamer); 5,5''-dimethyl terthiophene; 5,5''''-dimethyl quinquethiophene; 5,5'''''-dimethyl sexithiophene; 5,5'''-diethyl quaterthiophene; 5,5''''-diethyl quinquethiophene and 5,5'''''-diethyl sexithiophene.

* * * * *